United States Patent
Lin et al.

(10) Patent No.: US 9,431,591 B1
(45) Date of Patent: Aug. 30, 2016

(54) LED PACKAGE WITH REFLECTING CUP

(71) Applicant: ADVANCED OPTOELECTRONIC TECHNOLOGY, INC., Hsinchu Hsien (TW)

(72) Inventors: Hou-Te Lin, Hsinchu (TW); Pin-Chuan Chen, Hsinchu (TW); Lung-Hsin Chen, Hsinchu (TW); Wen-Liang Tseng, Hsinchu (TW)

(73) Assignee: ADVANCED OPTOELECTRONIC TECHNOLOGY, INC., Hsinchu Hsien (TW)

( * ) Notice: Subject to any disclaimer, the term of this patent is extended or adjusted under 35 U.S.C. 154(b) by 0 days.

(21) Appl. No.: 14/825,618

(22) Filed: Aug. 13, 2015

(30) Foreign Application Priority Data

Jul. 16, 2015 (CN) .......................... 2015 1 0417602

(51) Int. Cl.
| | |
|---|---|
| *H01L 33/60* | (2010.01) |
| *H01L 33/62* | (2010.01) |
| *H01L 33/48* | (2010.01) |
| *H01L 33/50* | (2010.01) |
| *H01L 33/54* | (2010.01) |

(52) U.S. Cl.
CPC ............. *H01L 33/60* (2013.01); *H01L 33/483* (2013.01); *H01L 33/505* (2013.01); *H01L 33/54* (2013.01); *H01L 33/62* (2013.01)

(58) Field of Classification Search
CPC ... H01L 33/483; H01L 33/505; H01L 33/54; H01L 33/62; H01L 33/60
See application file for complete search history.

(56) References Cited

U.S. PATENT DOCUMENTS

| | | | |
|---|---|---|---|
| 2011/0309388 A1* | 12/2011 | Ito ........................... | H01L 33/60 257/89 |
| 2014/0042481 A1* | 2/2014 | Inoue ...................... | H01L 33/46 257/98 |

* cited by examiner

*Primary Examiner* — Thanh V Pham
(74) *Attorney, Agent, or Firm* — Zhigang Ma

(57) ABSTRACT

The present disclosure provides a light emitting diode package which includes a plurality of electrodes, an LED die, a reflecting cup, and a phosphor layer. The LED die are electrically connected with the electrodes. The LED die includes a top light emitting surface and a plurality of lateral sides extending downward from the top light emitting surface. The reflecting cup is formed on the electrodes and surrounds the LED die. The reflecting cup includes an inner surface. The inner surface contacts with bottom portion of the LED die. A cavity is defined between the inner surface and other portion except the bottom portion of the LED die. The phosphor layer covers and seals the LED die.

15 Claims, 4 Drawing Sheets

LED PACKAGE WITH REFLECTING CUP

CROSS-REFERENCE TO RELATED APPLICATIONS

This application claims priority to Chinese patent application no. 201510417602.1 filed on Jul. 16, 2015, the contents of which are incorporated by reference herein.

FIELD

The subject matter generally relates to light emitting diode (LED) package and particularly relates to an LED package having a reflecting cup.

BACKGROUND

Illumination devices can be based on one or more different light sources. For example, light sources can include incandescent light bulbs, compact fluorescent lamps and fluorescent tubes. Recent developments have made use of light emitting diodes. In some implantations, the illumination device can include a reflective cup in conduction with an LED package.

BRIEF DESCRIPTION OF THE DRAWINGS

Implementations of the present technology will now be described, by way of example only, with reference to the attached figures.

DETAILED DESCRIPTION

Figure 1:
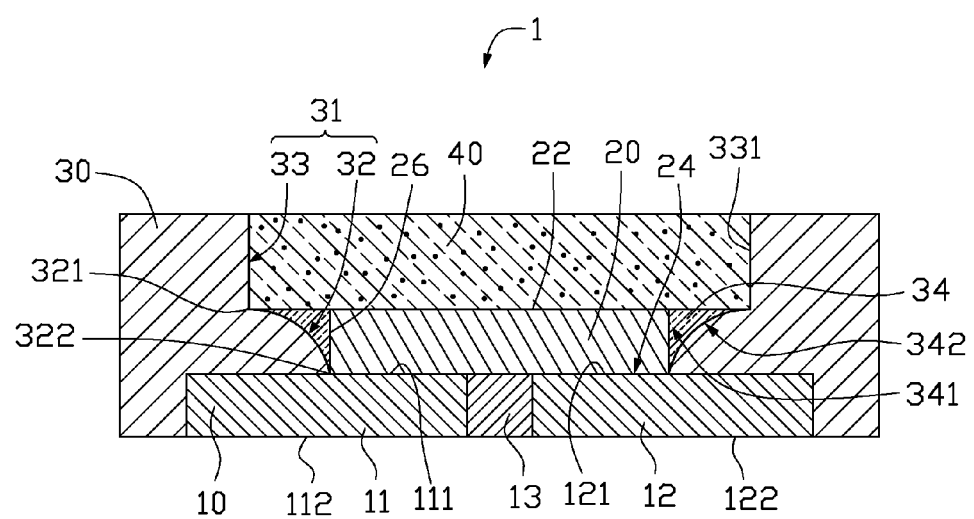
FIG. 1 is a diagrammatic, cross-sectional view of an LED package in accordance with an exemplary embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

A definition that applies throughout this disclosure will now be presented.

The term "comprising," when utilized, means "including, but not necessarily limited to"; it specifically indicates open-ended inclusion or membership in the so-described combination, group, series and the like.

The present disclosure is described in relation to an LED having a reflecting cup.

FIG. 1 illustrates a LED package 1 in accordance with a first embodiment of the present disclosure. The LED package 1 includes a plurality of electrodes 10, an LED die 20 electrically connected with the electrodes 10, a reflecting cup 30 formed on the electrodes 10 and surrounding the LED die 20, and a phosphor layer 40 covering and sealing the LED die 20.

The plurality of electrodes 10 include a first electrode 11 and a second electrode 12 spaced from the first electrode 11. The first electrode 11 includes a first top surface 111 and a first bottom surface 112 opposite to the first top surface 111. The second electrode 12 includes a second top surface 121 and a second bottom surface 122. The first top surface 111 and the second top surface 121 are configured for carrying and electrically connecting the LED die 20. The first bottom surface 112 and the second bottom surface 122 are exposed out of the LED package 1 and electrically connected to a circuit (not shown) for supplying power for the LED package 1.

The first electrode 11 and the second electrode 12 are made of metal having excellent electric capability, such as copper or aluminum. An insulating layer 13 is formed between the first electrode 11 and the second electrode 12. The insulating layer 13 is made of a material which does not conduct electricity. In the embodiment, the first top surface 111 and the second top surface 121 are coplanar. The first bottom surface 112 and the second bottom surface 122 are also coplanar. The LED die 20 is attached on the insulating layer 13 with one lateral side contacting with the first electrode 11 and the other lateral side contacting with the second electrode 12 to electrically connect the LED die 20 to the electrodes 10.

In the embodiment, the first electrode 11 and the second electrode 12 act as a substrate to carry the LED die 20, whereby an additional substrate for carrying the LED die 20 can be omitted.

The LED die 20 can be mounted on the electrodes 10 via wire bonding or flip chip bonding and so on. In this embodiment, the LED die 20 is mounted on the first electrode 11 and the second electrode 12 via flip chip bonding to omit a wire connecting the LED die 20 to the electrodes 10, thereby reducing a size of the LED package 1. The LED die 20 includes a top light emitting surface 22, a lower surface 24 and a plurality of lateral surfaces 26 connecting the top light emitting surface 22 and the lower surface 24. The lower surface 24 is attached on the first electrode 11, the insulating layer 13 and the second electrode 12. In the embodiment, a number of the lateral surfaces 26 is four.

Figure 2:
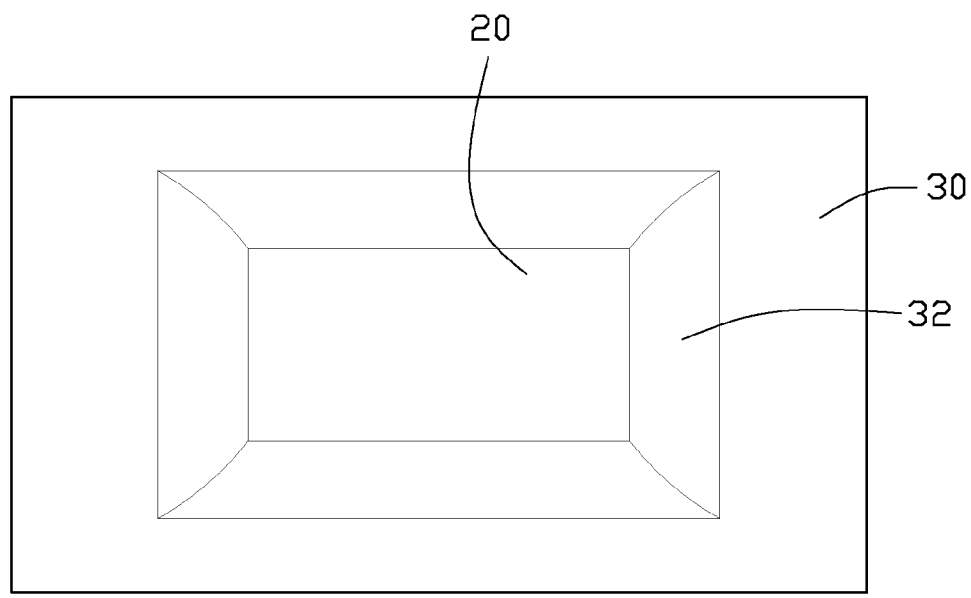
FIG. 2 is a top view of the LED package in FIG. 1.

As illustrated in FIG. 1 and also in FIG. 2, the reflecting cup 30 surrounds the LED die 20 and the electrodes 10. The reflecting cup 30 includes an inner surface 31. The inner surface 31 contacts with bottom portion of the lateral sides 26 of the LED die 20 and the inner surface 31 is away from the other portion of the LED die 20. The inner surface 31 extends along a direction from the bottom portion of the lateral sides 26 away from the electrodes 10 and the LED die 20.

The inner surface 31 includes a convex face 32 and a ladder 33 above the convex face 32. The convex face 32 protrudes towards the LED die 20. In this embodiment, the convex face 32 is curve. A beginning edge 321 of the convex face 32 is located at a joint between the LED die 20 and the electrodes 10. An ending edge 322 is coplanar with the top light emitting surface 22 of the LED die 20 and away from the LED die 20. In this embodiment, a cross section line of the convex face 32, from a beginning edge 321 to a ending edge 322, is arc-shaped.

A cavity 34 is defined between the inner surface 31 and the LED die 20. Specially, the cavity 34 is located between the convex face 32 of the inner surface 31 and the other portion except the bottom portion of the lateral sides 26 of the LED die 20. A transparent colloid 341 can be filled in the cavity 34. An upper surface of the transparent colloid 341 is coplanar to the top light emitting surface 22 of the LED die 20, and the upper surface of the transparent colloid 341 is coplanar to the ending edge 322 of the convex face 32. The transparent colloid 341 includes a concave face 342. The concave face 342 is recessed towards the LED die 20. The concave face 342 contacts with the convex face 32 entirely.

The phosphor layer 40 covers the LED die 20 and the transparent colloid 341. The phosphor layer 40 is received in the ladder 33. In this embodiment, the phosphor layer 40 is directly stacked on the top light emitting surface 22 and the transparent colloid 341. A top surface of the phosphor layer 40 is coplanar to a top surface of the reflecting cup 30. A bottom surface of the phosphor layer 40 contacts with the top light emitting surface 22 of the LED die 20 and the upper surface of the transparent colloid 341.

The ladder 33 includes a first conjoining face 331. The first conjoining face 331 extends perpendicularly from the ending edge 322 of the convex face 32 away from the electrodes 10. Side walls of the phosphor layer 40 are attached with the first conjoining face 331. The first conjoining face 331 surrounds to define a rectangular-shaped space, and the phosphor layer 40 can be made as a rectangular shape to be received therein.

Figure 3:
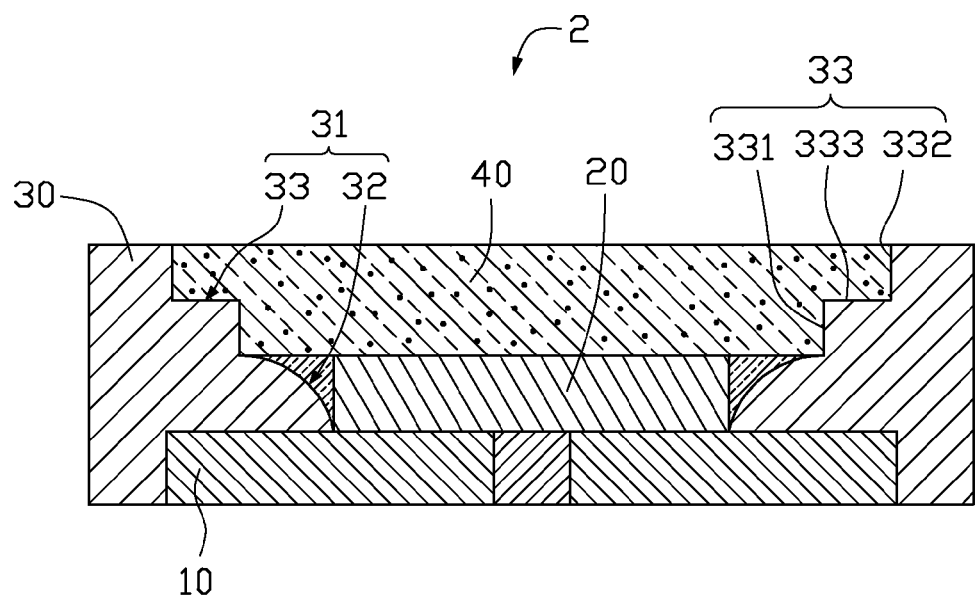
FIG. 3 is a diagrammatic, cross-sectional view of an LED package in accordance with an exemplary embodiment of the present disclosure.

FIG. 3 illustrates a LED package 2 in accordance with a second embodiment of the present disclosure. The LED package 2 also includes electrodes 10, an LED die 20 electrically connected with the electrodes 10, a reflecting cup 30 formed on the electrodes 10 and surrounding the LED die 20, and a phosphor layer 40 covering the LED die 20.

Figure 4:
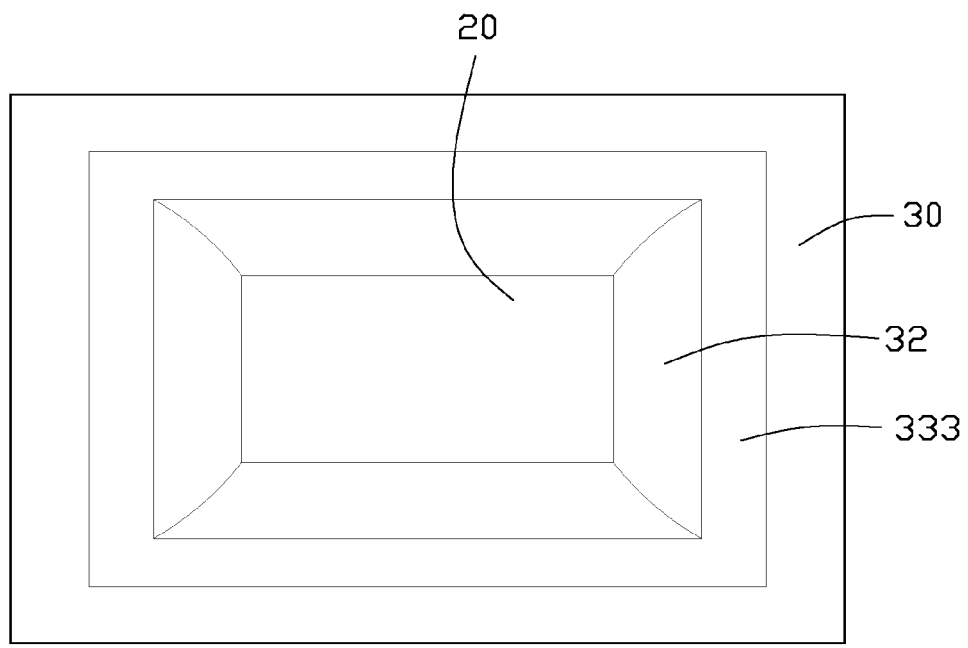
FIG. 4 is a top view of the LED package in FIG. 3.

The present disclosure also describes a difference between the LED package 2 of the second embodiment and the LED package 1 of the first embodiment. The ladder 33 in the second embodiment further includes a second conjoining face 332 and a connecting platform 333. The connecting platform 333 connects the first conjoining face 331 and the second conjoining face 332. A distance between the first conjoining face 331 and the LED die 20 is less than a distance between the second conjoining face 332 and the LED die 20. In this embodiment, the connecting platform 333 extends from top of the first conjoining face 331 away from the LED die 20. The connecting platform 333 can be horizontal. The second conjoining face 332 extends perpendicularly from an outer edge of the connecting platform 333 away from the electrodes 10. Also referring to FIG. 4, the first conjoining face 331, the connecting platform 333, and the second conjoining face 332 surround the LED die 20 to define a T-shaped space. Additionally, the phosphor layer 40 can be made as a T shape to be received therein.

The first conjoining face 331, the connecting platform 333, and the second conjoining face 332 are not limited to what is illustrated and described. In alternative embodiments, a shape of the first conjoining face 331, the connecting platform 333, and the second conjoining face 332 can be configured to conform to a desired form factor.

In the LED package (1, 2) in the present disclosure, the inner surface 31 of the reflecting cup 30 contacts with bottom portion of the LED die 20 and is spaced from the other portion of the LED die 20. Because the lateral sides 26 are not sheltered from the reflecting cup 30, light emitted from the LED die 20 can emit out not only from the top light emitting surface 22 but also from the lateral sides 26 of the light emitting diode 20, thereby increasing luminous efficiency.

Further, in the present LED package 1 or 2, part of the light emitted from the LED die 20 emits out of the LED package 1 or 2 directly, the other part of the light strikes on the convex face 32 of the reflective cup 30, and then emits out from the phosphor layer 40. The convex face 32 can result in a special light field.

It is to be further understood that even though numerous characteristics and advantages have been set forth in the foregoing description of embodiments, together with details of the structures and functions of the embodiments, the disclosure is illustrative only; and that changes may be made in detail, according in matters of shape, size, and arrangement of parts within the principles of the disclosure to the full extent indicated by the broad general meaning of the terms in which the appended claims are expressed.

The embodiments shown and described above are only examples. Many details are often found in the art such as the other features of An LED package. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. A light emitting diode (LED) package, comprising:
a plurality of electrodes;
an LED die electrically connected with the plurality of electrodes and comprising a top light emitting surface and a plurality of lateral sides extending downward from the top light emitting surface;
a reflecting cup formed on the electrodes and surrounding the LED die, the reflecting cup comprising an inner surface contacting with bottom portion of the LED die;
the inner surface and other portions, except the bottom portion, of the LED die forming a cavity; and
a phosphor layer covering and sealing the LED die;
wherein the inner surface comprises a convex face protruding towards the LED die;
wherein the inner surface further comprises a ladder to receive the phosphor layer, the ladder is above the convex face, and the ladder comprises a first conjoining face extending perpendicularly from the convex face away from the electrodes; and
wherein the ladder further comprises a second conjoining face and a connecting platform connecting the first conjoining face and the second conjoining face.

2. The LED package of claim 1, wherein a beginning edge of the convex face is located at a joint between the LED die and the electrodes.

3. The LED package of claim 2, wherein an ending edge of the convex face is coplanar with the top light emitting surface of the LED die and away from the LED die.

4. The LED package of claim 1, wherein the convex face is arc-shaped.

5. The LED package of claim 1, wherein a transparent colloid is filled in the cavity, and an upper surface of the transparent colloid is coplanar to the top light emitting surface of the LED die.

6. The LED package of claim 5, wherein the transparent colloid comprises a concave face, the concave face is recessed towards the LED die, and the concave face contacts with the convex face entirely.

7. The LED package of claim 5, wherein the phosphor layer is directly stacked on the top light emitting surface of the LED die and the transparent colloid.

8. The LED package of claim 1, wherein the first conjoining face surrounds the phosphor layer to define a rectangular-shaped space.

9. The LED package of claim 1, wherein a distance between the first conjoining face and the LED die is less than a distance between the second conjoining face and the LED die.

10. The LED package of claim 1, wherein the connecting platform extends from top of the first conjoining face away from the LED die, and the second conjoining face extends from an outer edge of the connecting platform away from the electrodes.

11. The LED package of claim 10, wherein the first conjoining face, the connecting platform and the second conjoining face surround the LED die to define a T-shaped space.

12. The LED package of claim 1, wherein the LED die is mounted on the electrode via flip chip bonding.

13. The LED package of claim 12, wherein the electrodes comprises a first electrode and a second electrode spaced from the first electrode, an insulating layer is formed between the first electrode and the second electrode.

14. The LED package of claim 13, wherein top surfaces of the first electrode and the second electrode are coplanar, and bottom surfaces of the first electrode and the second electrode are exposed out of the LED package.

15. The LED package of claim 13, wherein the LED die is attached on the insulating layer with one lateral side contacting with the first electrode and the other lateral side contacting with the second electrode to electrically connect the LED die to the electrodes.

* * * * *